United States Patent
List et al.

(10) Patent No.: US 12,287,378 B2
(45) Date of Patent: Apr. 29, 2025

(54) METHOD, COMPUTER PROGRAM, ELECTRONIC STORAGE MEDIUM AND DEVICE FOR DETECTING THE BREAKDOWN OF AN ENERGY RESERVE UNIT

(71) Applicant: Robert Bosch GmbH, Stuttgart (DE)

(72) Inventors: Carsten List, Walheim (DE); Clemens Willke, Oberstenfeld (DE); Florian Grasi, Heilbronn (DE); Hartmut Schumacher, Freiberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 386 days.

(21) Appl. No.: 17/780,291

(22) PCT Filed: Nov. 18, 2020

(86) PCT No.: PCT/EP2020/082532
§ 371 (c)(1),
(2) Date: May 26, 2022

(87) PCT Pub. No.: WO2021/129982
PCT Pub. Date: Jul. 1, 2021

(65) Prior Publication Data
US 2022/0413065 A1    Dec. 29, 2022

(30) Foreign Application Priority Data
Dec. 23, 2019    (DE) .................... 10 2019 220 536.4

(51) Int. Cl.
*G01R 31/64*    (2020.01)
*G01R 31/00*    (2006.01)
*B60R 21/017*    (2006.01)

(52) U.S. Cl.
CPC ........... *G01R 31/64* (2020.01); *G01R 31/007* (2013.01); *B60R 21/0173* (2013.01)

(58) Field of Classification Search
CPC ........ G01R 31/00; G01R 31/64; G01R 31/36; G01R 31/3647; G01R 31/3835;
(Continued)

(56) References Cited

U.S. PATENT DOCUMENTS

2005/0269870 A1* 12/2005 Ohashi .................. H02J 7/0029
303/20
2009/0088993 A1* 4/2009 Oohasi .................. B60L 3/0092
702/63
(Continued)

FOREIGN PATENT DOCUMENTS

DE    3744524 A1    7/1989
DE    19517698 A1    11/1996
(Continued)

OTHER PUBLICATIONS

International Search Report for PCT/EP2020/082532, Issued Feb. 4, 2021.

*Primary Examiner* — Son T Le
*Assistant Examiner* — Matthew W. Baca
(74) *Attorney, Agent, or Firm* — NORTON ROSE FULBRIGHT US LLP; Gerard A. Messina

(57) ABSTRACT

A method for recognizing the breakdown of an energy reserve device of at least two energy reserve devices of a device for protecting the occupants of a vehicle. The method includes: charging the at least two energy reserve devices to a test voltage level; ascertaining an ambient temperature of the at least two energy reserve devices; acquiring the (overall) capacitance of the at least two energy reserve devices; recognizing the breakdown of an energy reserve device as a function of a floating mean value, which is a function of the ascertained ambient temperature, for the (overall) capaci- (Continued)

tance and of the acquired (overall) capacitance; updating a floating mean value as a function of the ascertained ambient temperature and the acquired overall capacitance.

16 Claims, 1 Drawing Sheet

(58) Field of Classification Search
CPC .............. G01R 31/3842; G01R 31/385; G01R 31/382; G01R 31/387; G01R 31/388; G01R 31/392; G01R 31/396; G01R 31/006; G01R 31/007; G01R 31/016; G01R 27/26; G01R 27/2605; G01N 27/22; B60R 21/0173; B60R 21/01; H01M 10/48; H01M 10/482; H02J 7/0048; H02J 7/005; H02J 9/00; B60L 3/12; B60L 58/12; B60L 58/00; B60L 58/10; B60L 58/16; B60L 58/18

See application file for complete search history.

(56) References Cited

U.S. PATENT DOCUMENTS

| | | | |
|---|---|---|---|
| 2011/0018551 A1* | 1/2011 | Yamane | B60W 10/08 324/548 |
| 2012/0025613 A1 | 2/2012 | Morita et al. | |
| 2020/0363480 A1 | 11/2020 | Schnell | |

FOREIGN PATENT DOCUMENTS

| | | |
|---|---|---|
| DE | 102010028556 A1 | 11/2011 |
| DE | 102014207171 A1 | 10/2015 |
| DE | 102017221096 A1 | 5/2019 |
| DE | 112017007371 T5 | 12/2019 |
| EP | 1870289 A1 | 12/2007 |
| EP | 2658079 A2 | 10/2013 |
| EP | 3006244 A1 | 4/2016 |
| JP | H04127057 U | 11/1992 |
| JP | 2005331482 A | 12/2005 |
| JP | 2007030650 A | 2/2007 |
| JP | 2008014702 A | 1/2008 |
| JP | 2008235155 A | 10/2008 |
| WO | 8906366 A1 | 7/1989 |

* cited by examiner

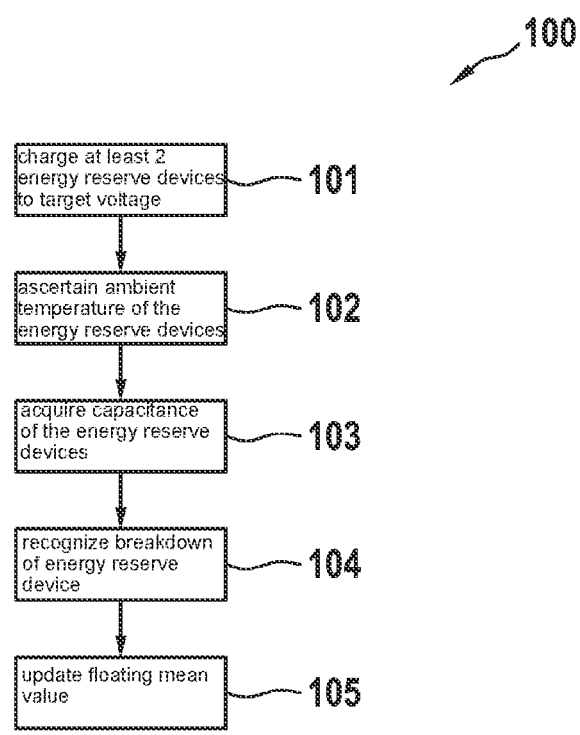

METHOD, COMPUTER PROGRAM, ELECTRONIC STORAGE MEDIUM AND DEVICE FOR DETECTING THE BREAKDOWN OF AN ENERGY RESERVE UNIT

FIELD

The present invention provides a method, a computer program, an electronic storage medium, and a device for recognizing the breakdown of one energy reserve device of at least two energy reserve devices of a device for protecting the occupants of a vehicle.

BACKGROUND INFORMATION

German Patent Application No. DE 37 44 524 A1 describes a method for testing the usability of an energy reserve device for a device for controlling an occupant protection device of a vehicle.

Here, in order to test the capacity of an energy reserve device (capacitor), this energy reserve device is discharged, starting from a first voltage value ($U_{s1}$) with a constant discharge current ($I_K$) until a specified second voltage value ($U_{s2}$) is reached. The discharge time ($t_E$) is measured. Given a known charge resistance ($R_E$), the current capacity of the energy reserve device can be calculated from the measured values.

Devices for controlling vehicle occupant protection systems (airbag systems) are designed in such a way that all known standard collisions can be handled, even when there is interruption of the energy supply, always from an energy reserve device, taking into account all tolerances, and the provided occupant protection means, such as restraint means (airbags) can be activated, and the required information relating to the collision can be stored in a data storage device (electronic data recorder (EDR)).

In medium-sized and larger systems, as a rule the energy reserve device used for this purpose is made up of two or more electrolytic capacitors. These electrolytic capacitors have a large capacitance tolerance as a result of their production conditions. Typical values are between 0% and 30% nominal tolerance upon delivery. A temperature dependence of approximately 15% in the temperature range from −40° C. to +105° C., as well as a decrease, caused by aging, in the capacitance by approximately 10% for an equivalent load of 2000 hours at 105° C., as well as a DC factor (1.0 to 1.3) as ratio of the direct-current capacitance to the standardized measured nominal capacitance for alternating current at 120 Hz.

SUMMARY

The present invention provides a method for recognizing the breakdown of one energy reserve device of at least two energy reserve devices, connected in parallel, of a device for controlling an occupant protection system of a vehicle.

The recognition of the breakdown of an electrolytic capacitor in systems having only one electrolytic capacitor is conventional.

In systems having two or more electrolytic capacitors connected in parallel, the conventional approaches do not work. This can be because the nominal capacitances of the individual capacitors can be different. However, even in systems having two or more electrolytic capacitors connected in parallel having substantially identical nominal capacitance, the capacitance tolerances due to production conditions are already sufficient to ensure that the conventional methods for breakdown recognition cannot be used with the required reliability.

Therefore, an object of the present invention is to recognize, in systems having two and more electrolytic capacitors connected in parallel as energy reserve, the mechanical loss due to breakdown (for example resulting from vibrations and the like), and, through the controlling of suitable indicator devices, such as a warning lamp, or other service information, or through the exchange of the control device, to initiate the correction of the error, although the minimum value of energy reserve to meet all requirements has not, or has not yet, been fallen below.

In this way, disturbances in the electronics/sensor system due to movement of a relatively heavy component (typical weight of an electrolytic capacitor: approximately 10 g to 20 g) can be prevented before such a disturbance has negative effects on the usability of the control device in the case of a collision.

This object may be achieved by the method according to the present invention. In accordance with an example embodiment of the present invention, the method includes the following steps:

charging the at least two energy reserve devices to a test voltage level (V_Test);

ascertaining an ambient temperature of the at least two energy reserve devices;

acquiring the (overall) capacitance of the at least two energy reserve devices;

recognizing the breakdown of an energy reserve device as a function of a floating mean value, which is a function of the ascertained ambient temperature, for the overall capacitance and of the acquired overall capacitance;

updating a floating mean value as a function of the ascertained ambient temperature and the acquired overall capacitance.

The present invention is based on the recognition that the capacitances of the energy reserve devices are a function of temperature. By taking into account the ambient temperature of the energy reserve devices, it is therefore advantageously possible to acquire the change in the measured capacitance values from vehicle start to vehicle start in a temperature-dependent manner, and, on the basis of a deviation of the current temperature-dependent capacitance value from a mean capacitance value under an essentially identical temperature condition, to securely and reliably recognize the breakdown of at least one of the at least two electrolytic capacitors.

According to a specific example embodiment of the method of the present invention, in the step of ascertaining the ambient temperature, a temperature value of a temperature sensor of a sensor unit of the device is acquired.

In the present context, a sensor unit is to be understood as a sensor that is not primarily a temperature sensor. Typically, devices for controlling vehicle occupant protection means (airbag control devices) have sensors for acquiring the forces acting on the vehicle (essentially acceleration sensors and rotational rate sensors). These sensors are sensor units in the sense of the present invention. These sensors can have a circuit that is capable of acquiring a temperature value. This specific embodiment of the method of the present invention uses such a circuit of such a sensor in order to ascertain the ambient temperature. Here, this specific example embodiment is based on the recognition that on the one hand the exact ambient temperature of the energy reserve device is not required for the method, and on the other hand that such a sensor is situated in the immediate vicinity of the energy reserve device, or at least in the same housing as the control device, and can therefore provide an adequately reliable temperature value for the ambient temperature of the energy reserve device.

According to a specific example embodiment of the method of the present invention, in the step of ascertaining the ambient temperature, a temperature value is acquired of a temperature sensor that acquires an interior compartment temperature of the vehicle.

The advantage of this specific example embodiment is that a temperature value of an interior compartment temperature of the vehicle is already present in many vehicles, in particular in vehicles having a climate control system, and this value can easily be accessed via an existing communication interface (e.g. via CAN, CAN-FD, FlexRay, Ethernet, and the like).

Although the temperature value of the interior compartment temperature is not the exact value of the ambient temperature of the energy reserve device, this temperature value is adequately reliable for carrying out the present invention.

According to a specific example embodiment of the method of the present invention, in the step of ascertaining the ambient temperature, a temperature class is determined as a function of the acquired temperature values.

This specific example embodiment is based on the recognition that it for the reliable recognition of the breakdown of at least one energy reserve device of at least two energy reserve devices for a device for controlling occupant protective means of a vehicle to assign the ambient temperature of the energy reserve devices to a temperature class and to carry out the temperature-dependent capacitance measurement and the temperature-dependent comparison on the basis of the assigned temperature class.

This specific example embodiment is based on the recognition that a reliable recognition of the breakdown of an energy reserve device is possible with a comparatively small number of temperature classes, for example only three, for the temperature ranges low (−40° C. to 0° C.), normal (0° C. to +40° C.), high (+40° C. to +80° C.).

In this way, this specific example embodiment has the advantage that on the one hand few mean values have to be maintained, namely only one for each temperature class, and on the other hand an updating of the mean values is easily possible because for each temperature range adequately reliable temperature values are ascertained that can then be taken into account for the formation of the mean value.

According to a specific example embodiment of the method of the present invention, in the step of updating the acquired overall capacitance is taken into account for the updating of the floating mean value only if the ascertained ambient temperature is below a specified threshold value for the ambient temperature.

If the temperature value of the ambient temperature is above a specified threshold value, this high ambient temperature has an effect on the tolerances of the energy reserve devices such that an appropriate measurement of the capacitances cannot be carried out with the required outlay. Thus, in the case of such an ambient temperature it is also not appropriate to take into account the acquired capacitance value for the updating of the temperature-dependent floating mean value.

According to a specific example embodiment of the method of the present invention, in the step of updating, the acquired overall capacitance is taken into account for the updating of the floating mean value only if the acquired overall capacitance is within a specified tolerance range for the at least two energy reserve devices.

If the currently acquired capacitance is not within the specified tolerance range for the capacitances, then it is unimportant whether there is a breakdown of an energy reserve device, because in such a case there is a more serious fault of the overall energy reserve devices. In such a case, it does not make sense to take into account the capacitance value acquired at such an ambient temperature for the updating of the temperature-dependent floating mean value.

According to a specific example embodiment of the method of the present invention, in the step of updating, the acquired overall capacitance is taken into account for the updating of the floating mean value only when the acquired (overall) capacitance is within a specified tolerance range for the floating mean value, which is a function of the ascertained ambient temperature, for the overall capacitance.

The temperature-dependent acquisition of the capacitance has a finite size; therefore, the individual capacitance measurement values of a control device will also correspondingly scatter. If the scatter value is too high, this indicates a specific situation that could cause a disturbance of the measurement. Such a measurement value can be recognized by this specific embodiment, and correspondingly not taken into account for the updating of the temperature-dependent floating mean value.

The three specific example embodiments described above are based on the recognition that the temperature-dependent floating mean value of the capacitances of the previous vehicle start is a central variable for the recognition of the breakdown of an energy reserve device. In order to make the method more robust, currently acquired capacitance values must fulfill any combination of the above conditions in order to be taken into account in the formation of the floating mean value. These specific embodiments can effectively prevent the temperature-dependent floating mean value from being weakened by individual outliers in the acquisition of the current capacitance.

A further aspect of the present invention is a computer program that is set up to carry out all steps of the method according to the present invention.

A further aspect of the present invention is an electronic storage medium on which the computer program according to the present invention is stored.

A further aspect of the present invention is a control device that is set up to carry out all steps of the method according to the present invention.

In the following, specific example embodiments of the present invention are explained in more detail on the basis of the FIGURE.

BRIEF DESCRIPTION OF THE DRAWING

FIG. 1 shows a flow diagram of a specific example embodiment of the method of the present invention.

DETAILED DESCRIPTION OF EXAMPLE EMBODIMENTS

FIG. 1 shows a flow diagram of a specific embodiment of method 100 of the present invention.

The method begins in a state in which energy reserve devices ER are charged to a specified target voltage level VER for the operation of the device for controlling occupant protective means of vehicles (airbag control device).

In step 101, the at least 2 energy reserve devices ER are charged to a specified target voltage for the capacitance test V_TEST. Energy reserve devices ER can be electrolytic capacitors. The target voltage for the capacitance test V_TEST can be for example 11 V. The charging can be controlled by microcontroller μC of the airbag control device. The μC can control the charging through the communication of corresponding control commands, via an SPI (Serial Peripheral Interface), to a charge circuit for the charging of the energy reserve devices ER.

In step 102, still before the start of the actual capacitance measurement, the ambient temperature of the at least two energy reserve devices ER is ascertained.

For this purpose, the μC can read out the temperature of the system ASIC via the SPI. Alongside the μC, the system ASIC is a central computing resource of the airbag control device. Typically, a system ASIC of an airbag control device includes a circuit for acquiring a temperature value of the system ASIC. Because the system ASIC and the energy reserve devices ER are typically situated immediately next to one another, or at least inside the same housing of the airbag control device, this temperature value can be used to ascertain the ambient temperature of the at least two energy reserve devices. Instead of a system ASIC, a second, possibly redundantly designed, μC, or a microprocessor pP can be situated in the airbag control device.

The read-out temperature value of the system ASIC, minus the inherent heating of the ASIC, gives the ambient temperature of the at least 2 energy reserve devices.

Alternatively or in addition, the μC can also access one or all temperature sensors of the sensor units that are used inside the housing of the airbag control device. Almost without correction, these give the internal temperature of the control devices, because there is almost no inherent heating.

Alternatively or in addition, the temperature value of the internal compartment of the vehicle can be accessed via a communication interface (for example CAN, CAN-FD, FlexRay, Ethernet, and the like).

With the ascertained ambient temperature before the start of the actual capacitance measurement is used for the determination of the temperature-dependent breakdown recognition according to the present invention.

In step 103, the capacitance of the at least two energy reserve devices ER is acquired. The acquisition takes place by applying a suitable charge current for a suitable acquisition time. The parameters charge current and acquisition time are strongly functionally dependent on the design of energy reserve devices ER and of the charge circuit. Because these are inherently the same parameters as in the conventional capacitance measurement of an individual electrolytic capacitor, it is within the ability of those skilled in the art to define the suitable charge current and the suitable acquisition time. These parameters are defined by the μC in the context of the controlling of the measurement and are communicated to the charge circuit or measurement circuit, for example by SPI.

A possibility for acquiring the capacitance is the comparison of the voltage of the energy reserve devices immediately before the application of the charge current for the measurement with the voltage of the energy reserve devices immediately after the elapsing of the suitable measurement time. From the difference in the voltages, the capacitance of the energy reserve devices can be directly ascertained. For this purpose, for the comparison the acquired voltages can be stored in suitable registers of the μC after digitization.

In the step of acquiring the capacitance, it is possible to check the acquired capacitance for the maintenance of specified minimum and maximum threshold values for the capacitance.

The ascertained capacitance value has to be within a permissible range that is determined by minimum $Cg_{min}$ and maximum $Cg_{max}$ threshold values for the overall capacitance.

Example: energy reserve device having 6 electrolytic capacitors connected in parallel, with a nominal capacitance at 120 Hz Cn of 4.5 mF each.

The overall nominal capacitance Cgn is then Cgn=6×4.5 mF=27 mF. The nominal tolerance originates from 0% to 30%; the Cgn temperature dependence is at approximately +/−5%, the measurement current tolerance +/−10%, VER difference voltage measurement tolerance +/−1%; the ADC accuracy +/−1 digit≈+/−2.5%; the ER leakage current at the moment of measurement is between 0% and 10%, the tolerance of the DC capacitance value relative to the AC nominal value=1.0 to 1.3; due to aging, a further 0 to 10% tolerance is to be taken into account.

Here, the maximum threshold value $Cg_{max}$=1.3×1.05×1.10×1.01×1.025×1.1×1.30×27 mF=60 mF;

The minimum threshold value Cgmin=1×0.95×0.9×0.99×0.975×1×1×0.9=20 mF.

If the acquired capacitance is outside the specified range, then, regardless of whether there is a breakdown of an energy reserve device, there is an error in the energy reserve devices that requires suitable error handling.

Such error handling can be the repetition of the capacitance measurement. It is possible that a defined maximum number can be specified for the repetition of the capacitance measurement before the error handling moves to a higher stage of escalation. At a higher stage, the outputting of a warning indication can take place, for example through the controlling of a warning lamp that prompts the user to visit a suitably equipped repair shop.

In step 104, there takes place the recognition of a breakdown of an energy reserve device. According to the present invention, the recognition takes place through a comparison of the capacitance, currently acquired in temperature-dependent fashion, of the energy reserve device with a temperature-dependent mean value of the capacitances. A breakdown is recognized when the currently acquired capacitance is below the temperature-dependent mean value of the capacitances beyond a specified threshold value AB_LIMIT. This is because such a deviation is not caused by temperature-related tolerances of the energy reserve devices, but rather is caused by a breakdown of one energy reserve device of the at least two energy reserve devices.

The following then holds for the recognition: $Cg(\vartheta x, k) \varepsilon [Cg_{min}(\vartheta x, k-1), MWg\_CG(\vartheta x, k-1)-AB\_LIMIT]$; where:

$Cg_{min}$: minimum value of the overall capacitance of the energy reserve devices;

$Cg(\vartheta x, k)$: the overall capacitance currently acquired in the temperature class $\vartheta x$ in the k-th measurement (where x ε n: low, c: normal, h: high);

$MWg\_CG(\vartheta x, k-1)$: the floating mean value for the overall capacitance and the temperature class x, based on the k−1-th measurements;

AB_LIMIT: threshold value for the capacitance measurement, which indicates a breakdown of one of the at least two energy reserve devices.

The specified threshold value AB_LIMIT for the recognition of the breakdown of one energy reserve device of at least two energy reserve devices can be specified easily and robustly relative to the maximum capacitance $Cg_{max}$.

Because there is a combined measurement imprecision of approximately +/−6.5%, it is recommended to take this imprecision into account in the threshold value for recognizing a breakdown, for example using the following simple and robust equation:

$$AB\_LIMIT = 0.065 \times Cg_{max}$$

For the example given above of an energy reserve device having an overall nominal capacitance of $Cgn = 6 \times 4.5$ mF=27 mF nominal capacitance and a maximum capacitance of $Cg_{max} = 60$ mF, there follows:

$$AB\_LIMIT = 0.065 \times 60 \text{ mF} = 3.9 \text{ mF}.$$

Here, the temperature dependence can be taken into account by selecting a temperature class $\vartheta x$ using the acquired temperature. For each temperature class $\vartheta x$, there can be a mean value of the capacitances of the preceding capacitance measurements. The mean value can be a floating mean value.

Three temperature classes $\vartheta x$, e.g. $\vartheta n$: low (−40° C. to 0° C.), $\vartheta c$: normal (0° C. to +40° C.), $\vartheta h$: high (+40° C. to +80° C.) have proven to be adequate to realize a reliable breakdown recognition using the method of the present invention.

Taking into account temperature classes, the threshold value for the recognition of a breakdown one threshold value per temperature class can be provided. For this purpose, the floating mean value can be formed according to the following condition:

AB_LIMIT $(\vartheta x) = 0.065 \times MWg\_CG$ $(\vartheta x, k-1)$; where MWg_CG($\vartheta x, k-1$): the floating mean value for the overall capacitance in the temperature class $\vartheta x$, based on the k−1-th measurements; $\vartheta x$: temperature class with x ε (n: low, c: normal, h: high).

In addition, it is possible to provide a threshold value for the temperature upon whose exceeding a reliable breakdown recognition no longer makes sense.

This threshold value can for example be the upper bound of the hottest temperature class (e.g. +80° C.). Above this threshold value, measurement errors in the temperature determination are too large. In addition, the tolerances of electrolytic capacitors at very high temperatures tend to become too complex to permit a usable breakdown recognition to be realized. If the threshold value is set sufficiently high, then it is not probable that this high temperature will actually occur.

If in step 104 no breakdown of an energy reserve device was recognized, then in step 105 the floating mean value is updated. The updating takes place as a function of temperature. In the case in which the temperature dependence is realized using temperature classes, the temperature-dependent updating takes place by updating the floating mean value of the assigned temperature class with the currently ascertained capacitance value. The floating mean values of the rest of the temperature classes are correspondingly not updated with the currently ascertained capacitance value.

In order to make the floating mean value for the overall capacitance more robust, the currently acquired overall capacitance can be taken into account for the updating of the floating mean value only when the ascertained ambient temperature is below a specified threshold value for the ambient temperature.

As threshold value, for this purpose a value of 80° C. is appropriate. Above this value, the tolerance behavior of electrolytic capacitors is very complex, so that a breakdown recognition is not possible with an appropriate use of resources. In addition, such high ambient temperatures very rarely occur, in particular when starting the vehicle.

In order to make the floating mean value for the overall capacitance more robust, the currently acquired overall capacitance can be taken into account for the updating of the floating mean value only when the acquired overall capacitance is within a specified tolerance range for the at least two energy reserve devices.

As tolerance range, the range of the absolute minimum ($Cg_{min}$) and maximum ($Cg_{max}$) capacitances for the airbag control device is appropriate. Typical values here are $Cg_{min} = 20$ mF and $Cg_{max} = 60$ mF.

In order to make the floating mean value for the overall capacitance more robust, the currently acquired overall capacitance can be taken into account for the updating of the floating mean value only when the acquired overall capacitance is within a specified tolerance range for the floating mean value, which is a function of the ascertained ambient temperature, of the overall capacitance.

The temperature-dependent acquisition of the capacitance has a finite size; therefore, the individual capacitance measurement values of a control device will also correspondingly scatter. If the scatter value is too high, this indicates a specific situation that could cause a disturbance of the measurement. Such a measurement value can be recognized by this specific embodiment, and correspondingly not taken into account for the updating of the temperature-dependent floating mean value.

For the tolerance range, for example the following can hold:

Cg $(\vartheta x, k) \varepsilon [MWg\_Cg (\vartheta x, k-1) - 0.4 * AB\_LIMIT, MWg\_Cg (\vartheta x, k-1) + 0.4 * AB\_LIMIT]$; where:

Cg($\vartheta x, k$): the overall capacitance currently acquired in the temperature class $\vartheta x$ (where x ε (n: low, c: normal, h: high)) in the k-th measurement;

MWg_CG($\vartheta x, k-1$): the floating mean value for the overall capacitance in the temperature class x based on the k−1-th measurements;

AB_LIMIT: threshold value for the capacitance measurement, indicating a breakdown of one of the at least two energy reserve devices.

What is claimed is:

1. A method for a device for protecting occupants of a vehicle, the device including a power device that includes plurality of energy reserves, the method comprising the following steps:

charging the plurality of energy reserves to an operating voltage level at which a voltage of the plurality of energy reserves has a first voltage value for control of an occupant protection device; and performing a plurality of breakdown checks, wherein:

each of the plurality of breakdown checks includes:

controlling a charge of the plurality of energy reserves to a test voltage level at which the voltage of the plurality of energy reserves has a second voltage value different than the first voltage value;

using a temperature sensor to ascertain an ambient temperature of the plurality of energy reserves that exists when the voltage of the plurality of energy devices is at the second voltage value due to the controlling of the charge;

when the voltage of the plurality of energy reserves is at the second voltage value due to the controlling of the charge, performing an electrical control of the plurality of energy reserves to thereby acquire an overall capacitance of the plurality of energy reserves;

based on the ascertained ambient temperature, selecting one of a plurality of floating mean overall capacitance values stored in an electronic storage; and comparing the acquired overall capacitance to the selected floating mean overall capacitance value;

one or more first ones of the plurality of breakdown checks includes, based on a result of the comparison, updating in the electronic storage the floating mean overall capacitance value that has been selected in the respective check, the updating modifying the selected floating mean overall capacitance value to reflect the overall capacitance acquired in the respective check; and one or more second ones of the plurality of breakdown checks includes recognizing a breakdown of at least one of the plurality of energy reserves as a function of a comparison between the floating mean overall capacitance value; that has been selected in the respective check and the overall capacitance of the plurality of energy reserves that has been acquired in the respective check.

2. The method as recited in claim 1, wherein the breakdown of the energy reserves is recognized when the acquired overall capacitance is below the selected floating mean overall capacitance value beyond a specified threshold value.

3. The method as recited in claim 1, wherein the temperature sensor is part of a sensor unit that is configured to acquire forces acting on the vehicle.

4. The method as recited in claim 1, wherein the temperature sensor acquires, as the ascertained ambient temperature, an interior compartment temperature of the vehicle.

5. The method as recited in claim 1, wherein:
each of the plurality of breakdown checks includes classifying the ascertained ambient temperature into one of a plurality of temperature classes that each corresponds to a respective one of a plurality of temperature ranges; and
the selection of the one of the plurality of floating mean overall capacitance values is carried out based on the classification.

6. The method as recited in claim 5, wherein the plurality of temperature ranges includes a first range of from −40° C. to 0° C., a second range of from 0° C. to +40° C., and a third range of from +40° C. to +80° C.

7. The method as recited in claim 6, wherein;
each of the plurality of floating mean overall capacitance values is assigned to a respective one of the temperature classes; and
the breakdown of the energy reserves is recognized when the acquired overall capacitance is below the selected floating mean overall capacitance value beyond one of a plurality of threshold values specified for the temperature class into which the ascertained ambient temperature of the respective check has been classifier, different ones of the plurality of threshold values being specified for different ones of temperature classes.

8. The method as recited in claim 1, wherein the updating is performed only with satisfaction of a predefined condition that the ascertained ambient temperature is below a specified threshold temperature value, the predefined condition being satisfied in each of the one or more first ones of the plurality of breakdown checks.

9. The method as recited in claim 1, wherein the updating is performed only with satisfaction of a predefined condition that the acquired overall capacitance of the respective check is within a specified tolerance range for the at least two energy reserves, the predefined condition being satisfied in each of the one or more first ones of the plurality of breakdown checks.

10. The method as recited in claim 1, wherein the updating is performed only with satisfaction of a predefined condition that the acquired overall capacitance is within a specified tolerance range for the floating mean overall capacitance value, selected in the respective check, the predefined condition being satisfied in each of the one or more first ones of the plurality of breakdown checks.

11. The method as recited in claim 1, the respective ones of the plurality of breakdown checks are performed method for the recognition of the breakdown of at respective vehicle starts, and the selected floating mean overall capacitance of each of the checks performed at a respective one of the vehicle starts originates from a previous one of the vehicle starts.

12. The method as recited in claim 1, further comprising:
while the plurality of energy reserves are in a condition in which they are chargeable to the operating voltage level and are usable for the control of the occupant protection device, modifying the power device in response to the recognition of the breakdown.

13. The method as recited in claim 1, wherein:
the electrical control includes:
applying a predefined charge current for a predefined time period; and
upon reaching an end of the predefined time period, measuring a current value of the voltage; and
the overall capacitance is acquired based on the measured current value.

14. The method as recited in claim 13, wherein the acquiring of the overall capacitance is performed by comparing the measured current value to the second voltage value.

15. A non-transitory electronic storage medium on which is stored a computer program that is executable by a computer, and that, when executed by the computer, causes the computer to perform a method for a device for protecting occupants of a vehicle, the device including a power device that includes a plurality of energy reserves, the method comprising performance of the following steps:
charging the plurality of energy reserves to an operating voltage level at which a voltage of the plurality of energy reserves has a first voltage value for control of an occupant protection device; and
performing a plurality of breakdown checks, wherein:
each of the plurality of breakdown checks includes:
controlling a charge of the plurality of energy reserves to a test voltage level at which the voltage of the plurality of energy reserves has a second voltage value different than the first voltage value;
using a temperature sensor to ascertain an ambient temperature of the plurality of energy reserves devices that exists when the voltage of the plurality of energy devices is at the second voltage value due to the controlling of the charge;
when the voltage of the plurality of energy reserves is at the second voltage value due to the controlling of the charge, performing an electrical control of the plurality of energy reserves to thereby acquire an overall capacitance of the plurality of energy reserves;
based on the ascertained ambient temperature, selecting one of a plurality of floating mean overall capacitance values stored in an electronic storage; and comparing the acquired overall capacitance to the selected floating mean overall capacitance value;

one or more first ones of the plurality of breakdown checks includes, based on a result of the comparison, updating in the electronic storage the floating mean overall capacitance value that has been selected in the respective check, the updating modifying the selected floating mean overall capacitance value to reflect the overall capacitance acquired in the respective check; and one or more second ones of the plurality of breakdown checks includes recognizing a breakdown of at least one of the plurality of energy reserves as a function of a comparison between the floating mean overall capacitance value; that has been selected in the respective check and the overall capacitance of the plurality of energy reserves that has been acquired in the respective check.

16. A control device comprising a processor configured to perform a method for a protecting device for protecting occupants of a vehicle, the protecting device including a power device that includes plurality of energy reserves, the processor, for executing the method, being configured to:

charge the plurality of energy reserves to an operating voltage level at which a voltage of the plurality of energy reserves has a first voltage value for control of an occupant protection device; and perform a plurality of breakdown checks, wherein:

each of the plurality of breakdown checks includes:

controlling a charge of the plurality of energy reserves to a test voltage level at which the voltage of the plurality of energy reserves has a second voltage value different than the first voltage value;

using a temperature sensor to ascertain an ambient temperature of the at plurality of energy reserves that exists when the voltage of the plurality of energy devices is at the second voltage value due to the controlling of the charge;

when the voltage of the plurality of energy reserves is at the second voltage value due to the controlling of the charge, performing an electrical control of the plurality of energy reserves to thereby acquire an overall capacitance of the plurality of energy reserves;

based on the ascertained ambient temperature, selecting one of a plurality of floating mean overall capacitance values stored in an electronic storage; and comparing the acquired overall capacitance to the selected floating mean overall capacitance value;

one or more first ones of the plurality of breakdown checks includes, based on a result of the comparison, updating in the electronic storage the floating mean overall capacitance value that has been selected in the respective check, the updating modifying the selected floating mean overall capacitance value to reflect the overall capacitance acquired in the respective check; and one or more second ones of the plurality of breakdown checks includes recognizing a breakdown of at least one of the plurality of energy reserves as a function of a comparison between the floating mean overall capacitance value that has been selected in the respective check and the overall capacitance of the plurality of energy reserves that has been acquired in the respective check.

* * * * *